United States Patent [19]

Preschutti et al.

[11] Patent Number: 4,517,521
[45] Date of Patent: May 14, 1985

[54] FEED FORWARD CIRCUIT AND A METHOD FOR ALIGNING AND BALANCING THE SAME

[75] Inventors: Joseph P. Preschutti, State College; John C. Pavlic, Pleasant Gap, both of Pa.

[73] Assignee: C-COR Electronics, Inc., State College, Pa.

[21] Appl. No.: 584,494

[22] Filed: Feb. 28, 1984

[51] Int. Cl.³ .............................................. H03F 1/32
[52] U.S. Cl. ....................................... 330/2; 330/149; 330/151
[58] Field of Search .................... 330/2, 52, 149, 151; 324/83 R, 98

[56] References Cited

U.S. PATENT DOCUMENTS 3,541,467 11/1970 Seidel .............................. 330/149 X
3,886,470 5/1975 O'Neil et al. ......................... 330/149

OTHER PUBLICATIONS

"450 Mhz CATV Feedforward Hybrid Amplifier", TRW Form No. 732/1283.

Primary Examiner—James B. Mullins
Assistant Examiner—Steven J. Mottola
Attorney, Agent, or Firm—Stanley J. Price, Jr.

[57] ABSTRACT

An improved feed forward circuit and a method of aligning and balancing the improved feed forward circuit. The feed forward circuit includes a first circuit loop to isolate signal noise and distortion and a second circuit loop to reduce signal noise and distortion. The first circuit loop and the second circuit loop have directional coupler means, amplification means, and delay means. The first circuit loop and the second circuit loop are interconnected through a pair of common directional coupler means having common balance circuitry connected therebetween. The first circuit loop has a signal input terminal and an input test terminal and the second circuit loop has a signal output terminal and an output test terminal. The improvement in the feed forward circuit includes a pair of additional directional coupler means. One of the additional directional coupler means is connected with the first circuit loop with the input test terminal and the other additional directional coupler means is connected with the second circuit loop with the output test terminal. The additional directional coupler means is operable to promote an accurate alignment and balance of the feed forward circuit and improve gain flatness and reduce signal distortion during operation thereof. A method is also provided for aligning and balancing of a feed forward circuit including the above described components. The presence of the additional directional coupler means in the improved feed forward circuit substantially reduces the magnitude of any undesirable signal present during alignment and balancing to promote an accurate alignment and balancing of the feed forward circuit.

8 Claims, 3 Drawing Figures

FEED FORWARD CIRCUIT AND A METHOD FOR ALIGNING AND BALANCING THE SAME

BACKGROUND OF THE INVENTION

1. Field of the Invention

This invention relates to an improved feed forward circuit and to a method for aligning and balancing the feed forward circuit and, more particularly, to an improved feed forward circuit which can improve the accuracy of the alignment and balancing of the circuit to allow for improved gain flatness and improved distortion reduction characteristics in the circuit.

2. Description of the Prior Art

Various feed forward circuits have been known in the art to provide for distortion reduction of a signal which is amplified as it passes through the circuit. Typically, the feed forward circuit has two cancellation loops, the first isolates noise and distortion and the second produces the distortion cancellation phenomena. If the cancellation process were ideal, the output signal would be in exact replica of the input signal which has been appropriately amplified without the noise and distortion created by amplification in the circuit.

A typical feed forward circuit has a first circuit loop or, a main loop, and a second circuit loop, or error loop. Each loop has amplification means, directional coupler means, and delay means interconnected by common balance circuits and common directional couplers to both loops of the circuit. An signal input terminal and generally a test input terminal are provided in the first circuit loop and a signal output terminal and generally a test output terminal are provided in the second circuit loop. The first circuit loop serves to isolate the noise and distortion created by the amplification means in that loop and the second circuit loop provides reduction of noise and distortion.

Ideally, the feed forward circuit would provide a replica of the input signal, appropriately amplified, without any distortion. The feed forward circuit relies on cancellation to provide noise and distortion reduction. In attempting to provide an output signal which is an amplified replica of the input signal, prior feed forward circuits have been limited by the cancellation capability of the main loop and error loop in the circuit through alignment and balancing of these loops. Inaccurate alignment and balancing also promotes a degredation of gain flatness in the circuit.

For broadband multi-channel operation, two push-pull cascode hybrid integrated radio frequency (RF) amplifiers are typically used in the feed forward circuit, one amplifier in the main loop and one in the error loop of the feed forward circuit. One known method of aligning and balancing a feed forward circuit having radio frequency amplifiers is the termination method. The termination method of alignment and balancing has two basic steps. The first step is to align the balance circuit and adjust the delay means, such as a delay line, in the error loop to provide cancellation in the error loop. This is accomplished by removing the delay means in the main loop, such as a delay line, and replacing this delay line in the main loop with, for example, proper terminating resistors. A signal derived from the test signal generator is then injected at the signal input terminal of the first circuit loop. Initially, the amplification means in the second circuit loop, such as an error amplifier, is turned off to produce a reference signal with no cancellation. Then, the error amplifier is turned on and balancing and delay adjustments are made to produce an output voltage which is a combination of the reference signal and a cancellation signal. The output voltage at the signal output terminal desirably should made as low as possible, thereby indicating a high degree of cancellation.

A disadvantage inherent in this method of aligning and balancing the error loop is that when the delay means, such as a delay line, is placed back into the circuit, a mismatch of impedance occurs between certain directional coupler means and the delay line in the first circuit loop which promotes a change in the transfer characteristics in certain of the directional coupler means. This change in transfer characteristics effects the balance of the previously adjusted error loop of the feed forward circuit. This imbalance limits the ultimate distortion cancellation characteristics of the circuit by limiting the accuracy of the balancing of the error loop. Typically, circuits balanced with this technique will be limited to approximately 22 to 26 dB cancellation, particularly at frequencies above 200 MHz where parasitic and distributed impedances of the circuit elements of the directional coupler means, such as directional couplers, reduce the port-to-port isolation of the directional couplers used in the feed forward circuits.

This typical limitation of 22 to 26 dB cancellation, for example, places constraints on the most important performance characteristic of a feed forward circuit, namely, the reduction of undesired output signals by cancellation in the error loop of the feed forward circuit. If the cancellation in the error loop could be improved by a more accurate alignment and balancing of this portion of the circuit, the distortion reduction capability of the circuit could be improved.

In balancing the main loop of the feed forward circuit by the termination method, a similar process exists as when balancing the error loop by the termination method except that the delay means in the second circuit loop, or error loop, is removed and replaced with, for example, proper terminating resistors. In balancing the main amplifier loop, the main amplifier is first turned off and signal is passed through the signal input terminal of the first circuit loop to provide a reference signal. Then the main amplifier is turned on and balancing and delay adjustments are made to produce an output signal which is a combination of the reference signal and a cancellation signal, the cancellation signal having passed through the amplifier of the main loop, the balance circuitry, and the error amplifier of the second loop to the output signal terminal in the error loop. The output voltage at the signal output terminal of the error loop is a combination of the reference signal and the cancellation signal. The voltage measured for the output signal should be made as low as possible to provide a high degree of cancellation in the main loop. The result of imbalance or imperfect cancellation in the main amplifier loop is degradation of the flatness of the gain versus frequency response of the circuit. Similar impedance matching problems are encountered when the delay means, such as a delay line, is placed back into the circuit which limits the accuracy of balancing of the main loop. Inaccuracy in balancing promotes this degradation of the gain flatness, as described above.

Another known method of aligning and balancing of feed forward circuits is the resistive injection circuit alignment method. In this method, in addition to the signal input terminal in the first circuit loop, or main loop, and the signal output terminal in the second circuit loop, or error loop, an input resistive test terminal is provided in the first circuit loop and an output resistive test terminal is provided in the second circuit loop.

Like the termination method, the resistive injection circuit alignment method also requires two stages of alignment. The first stage of alignment involves balancing and aligning the error loop of the feed forward circuit. In this first stage of alignment a test signal is injected at the input resistive test terminal and the error amplifier in the error loop is turned off to provide a reference signal of a given reference voltage at the signal output terminal of the error loop with the circuit input terminated with the proper resistance. The error amplifier in the error loop is then turned on and the circuit is balanced by adjusting the balance circuitry and certain directional coupler means. With the error amplifier on, in addition to the reference signal, a cancellation signal is also produced at the signal output terminal of the error loop. The magnitude of the cancellation signal is adjusted by adjusting the loss of the balance circuits to attempt to match the magnitude characteristics of the reference voltage. The degree of precision of balancing the circuit is to reduce the magnitude of the combination of the reference signal and the cancellation signal. However, an undesired signal is also present at the signal output terminal in addition to the reference and cancellation signals. The undesired signal proceeds from the input resistive test terminal through the input directional coupler means then through the delay line means of the first circuit loop, the error amplifier of the error loop to the signal output terminal in the error loop. The presence of the undesirable signal at the output terminal presents a serious limitation to the accuracy of the cancellation measurements made by attempting to measure the difference between the reference signal and the cancellation signal to provide a reliable cancellation alignment of, typically 30 dB.

The alignment of the main loop in the feed forward circuit in the resistive injection circuit alignment method is similar to the alignment of the error loop by this method. However, in this method the signal is input to the signal input terminal of the main loop and output is measured at the output resistive test terminal in the error loop with the circuit output terminated with the proper resistance. To obtain a reference signal, the main amplifier in the main loop is turned off and a reference signal which proceeds from the signal input terminal in the main loop through the delay means in the first loop through the error amplifier of the second loop is measured at the output resistive test terminal of the error loop. After the magnitude of this reference signal has been measured, the main amplifier is then turned on and a cancellation signal is also present at the output resistive test terminal. The path of this cancellation signal has proceeded from the signal input terminal in the main loop through the main amplifier in the main loop through, the balance circuitry, and the through the error amplifier in the error loop to provide a cancellation signal at the output resistive test terminal in the error loop. The magnitude of the cancellation signal is adjusted by adjusting the loss of the balancing circuits to attempt to precisely match the magnitude characteristics of the reference signal, such as when balancing the error loop by this method. The degree of precision in balancing the circuit relies upon the capability of the balancing process to reduce the magnitude of the combination of the reference signal and the cancellation signal to a relatively low magnitude as measured at the output resistive test terminal. However, as when balancing the error loop by the resistive injection circuit alignment method, an undesirable signal is also present at the output resistive test terminal. The path of the undesired signal proceeds from the signal input terminal in the main loop through the main amplifier in the main loop through the delay means of the error loop to the output resistive test terminal in the error loop. As in the case in balancing the error loop by this method, a serious limitation is present in regard to the accuracy of the cancellation measurements made by attempting to measure the magnitude of the difference of the reference voltage and the cancellation voltage at the output resitive test terminal to provide a reliable cancellation alignment.

What is needed, therefore, is an improved feed forward circuit and a method for aligning and balancing the same which can provide improved accuracy in the alignment and balancing of the circuit and provide an improved gain flatness and improved distortion reduction characteristics in the feed forward circuit. What is further needed is an improved feed forward circuit and a method for aligning and balancing the circuit which can allow all circuit components to remain in place during alignment and balancing to promote the elimination of impedance matching problems. What is also needed is an improved feed forward circuit and method for aligning and balancing the same which promotes the substantial elimination of undesired signals in the alignment and balancing process to provide for a high degree of accuracy in alignment and balancing of the feed forward circuit.

SUMMARY OF THE INVENTION

In accordance with the present invention there is provided an improved feed forward circuit and a method for aligning and balancing a feed forward circuit. The improved feed forward circuit has a first circuit loop to isolate signal noise and distortion and a second circuit loop to reduce signal noise and distortion. The first circuit loop and the second circuit loop have directional coupler means, amplification means and delay means. The first circuit loop and the second loop are interconnected through a pair of common directional coupler means having common balance circuitry connected therebetween. The first circuit loop has a signal input terminal and an input test terminal; and the second circuit loop has a signal output terminal and an output test terminal. The improvement to this feed forward circuit is a pair of additional directional coupler means. One of the additional directional coupler means is connected in circuit relationship with the first circuit loop and the input test terminal; and the other of the additional directional coupler means is connected in circuit relationship with the second circuit loop and the output test terminal. The additional directional coupler means are operable to promote accurate alignment and balance of the feed forward circuit and improve the gain flatness and reduce signal distortion during operation of the improved feed forward circuit.

Desirably, the additional directional coupler means in the first circuit loop is connected in circuit relationship with the input of the amplification means in the first circuit loop. It is desirable that the additional directional coupler means in the second circuit loop is connected in circuit relationship with the output with the amplification means in the second circuit loop. It is desirable that the additional directional coupler means are directional couplers.

As mentioned above the present invention provides a method for aligning and balancing a feed forward circuit. The feed forward circuit includes a first circuit loop to isolate signal noise and distortion and a second circuit loop to reduce signal noise and distortion. The first circuit loop and the second circuit loop have directional coupler means, amplification means, and delay means. The first circuit loop and the second loop are interconnected through a pair of common directional coupler means having common balance circuitry connected therebetween. The first circuit loop has a signal input terminal, an input test terminal and an additional directional coupler means, the additional directional coupler means in the first circuit loop is connected with the input test terminal. The second circuit loop has a signal output terminal, an output test terminal, and an additional directional coupler means, the additional directional coupler means in the second circuit loop is connected with the output test terminal. The method includes providing a test signal at the input test terminal of the first circuit loop. The test signal is then passed from the input test terminal through the additional directional coupler means and the amplification means of the first circuit loop, one of the common directional coupler means, and the delay means and the directional coupler means of the second circuit loop to provide a referece signal having a magnitude of $V_{ref}$ at the signal output terminal the second circuit loop. The method also includes passing the test signal from the input test terminal through the additional directional coupler means and the amplification means of the first circuit loop, one of the common directional coupler means, the balance circuitry, the other common directional coupler means, the amplification means and the additional directional coupler means and the directional coupler means of the second circuit loop to provide a cancellation signal having a magnitude of $V_{canc}$ at the signal output terminal of the second circuit loop. The difference between the magnitude of $V_{ref}$ and $V_{canc}$ at the signal output terminal is measured to provide for an accurate alignment and balance of the second circuit loop in the feed forward circuit. The additional directional coupler means of the first circuit loop substantially reduces the magnitude of any undesirable signal at the signal output terminal of the second circuit loop allowing an accurate measurement of the difference between $V_{ref}$ and $V_{canc}$.

The present invention also provides a method for aligning and balancing the first circuit loop of the above discribed improved feed forward circuit. In the method of balancing the first circuit loop, a test signal is provided at the signal input terminal of the first circuit loop. The test signal from the signal input terminal is passed through the directional coupler means and the delay means of the first circuit loop, one of the common directional coupler means, the amplification means and the additional directional coupler means of the second circuit loop to provide a reference signal having a magnitude of $V_{ref}'$ at the output test terminal of the second circuit loop. The test signal is also passed from said signal input terminal through the directional coupler means and the additional directional coupler means and the amplification means of the first circuit loop, one of the common directional coupler means, the balance circuitry, the other of the common directional coupler means, the amplification means and the additional directional coupler means of the second circuit loop to provide a cancellation signal having a magnitude of $V_{canc}'$ at the output test terminal of the second circuit loop. The difference between $V_{ref}'$ and $V_{canc}'$ is measured at the output test terminal to provide for an accurate alignment and balance of the first circuit loop. The additional directional coupler means of the second circuit loop substantially reduces the magnitude of any undesirable signal at the output test terminal of the second circuit loop allowing an accurate measurement of the difference between $V_{ref}'$ and $V_{canc}'$. It is preferable that the method for aligning and balancing the first circuit loop and the method for aligning and balancing the second circuit loop of the feed forward circuit both be performed. Balancing and aligning the first circuit loop and the second circuit loop significantly improves the accuracy of the alignment and balancing process, thus improving the gain flatness and the distortion reduction characteristics of the feed forward circuit.

Accordingly, an objective of the present invention is to provide an improved feed forward circuit and a method for aligning and balancing the circuit which improves the accuracy of the alignment and balancing process to promote an improved gain flatness and improved distortion reduction characteristics in the feed forward circuit.

An additional objective of the present invention is to obviate the need to remove certain circuit components from the feed forward circuit during alignment and balancing of the circuit to promote elimination of impedance matching problems in the circuit during operation thereof.

Another objective of the present invention is to substantially reduce the magnitude of any undesirable signal which may be present during alignment and balancing of the feed forward circuit to promote accurate alignment and balancing of the feed forward circuit.

These and other objectives of the present invention will be more completely disclosed and described in the following specification, the accompanying drawings, and appended claims.

DESCRIPTION OF THE PREFERRED EMBODIMENTS

Figure 1:
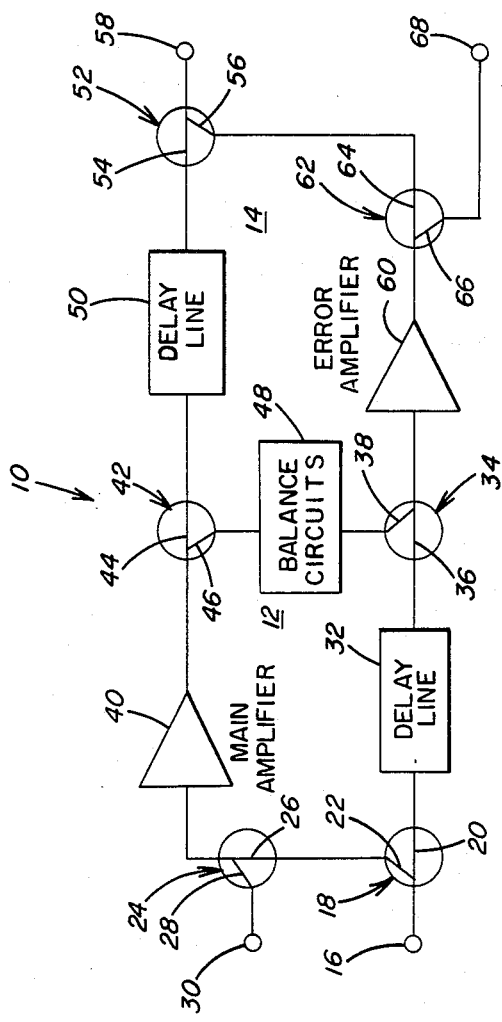
FIG. 1 shows an embodiment of an improved feed forward circuit of the present invention in functional block diagram form.

Referring to FIG. 1, there is illustrated an improved feed forward circuit, generally designated by the numeral 10. Circuit 10 has a main loop or first circuit loop, generally designated by the numeral 12 and an error loop or second circuit loop generally designated by the numeral 14. First circuit loop 12 serves to isolate signal noise and distortion and second circuit loop 14 serves to reduce signal noise and distortion to provide an output signal which has the requisite degree of amplification at the output of circuit 10 with noise and distortion substantially minimized. These functions of isolation and noise distortion are commonly associated with feed forward circuits.

First circuit loop 12 has a signal input terminal 16. Signal input terminal 16 is connected to directional coupler 18. Directional coupler 18 has through leg 20 and a down leg 22. The directional coupler 18 is connected through its down leg 22 to directional coupler 24 to its through leg 26. An input test terminal 30 is connected to down leg 28 of directional coupler 24.

Directional coupler 18 is connected through its through leg 20 to delay line 32. Delay line 32 is connected to directional coupler 34 to its through leg 36. Directional coupler 34 also has a down leg 38.

A main amplifier 40 on its input side is connected to directional coupler 24 and on its output side to directional coupler 42. Directional coupler 42 has a through leg 44 and a down leg 46. Conventional balance circuits 48 for a feed forward circuit shown in block diagram form in FIG. 1 is connected to directional coupler 42 to its down leg 46 at one end and is connected at its other end to directional coupler 34 to down leg 38 of directional coupler 34.

Second circuit loop 14 is interconnected to first circuit loop 12 through directional coupler 42, balance circuits 48 and directional coupler 34, directional coupler 42, balance circuits 48 and directional coupler 34 being common to first circuit loop 12 and second circuit loop 14. Second circuit loop 14 also has a delay line 50 which is connected to directional coupler 42 to its through leg 44. Delay line 50 is also connected to directional coupler 52 to its through leg 54. Directional coupler 52 also has a down leg 56. Second circuit loop 14 has a signal output terminal 58 connected to directional coupler 52.

Second circuit loop 14 has an error amplifier 60. Error amplifier 60 is connected at its input side to directional coupler 34 and is connected on its output side to a directional coupler 62. Directional coupler 62 having a through leg 64 and a down leg 66. An output test terminal 68 is connected to down leg 66 of directional coupler 62. Directional coupler 62 is connected to directional coupler 52, through leg 64 of directional coupler 62 being connected to down leg 56 of directional coupler 52 in second circuit loop 14.

Circuit 10 described above discloses an embodiment of an improved feed forward circuit of the present invention. The improvement to the feed forward circuit over those previously known in the art is the inclusion of an additional pair of directional couplers, directional couplers 24 and 62, directional coupler 24 being located in first circuit loop 12 and directional coupler 62 being located in second circuit loop 14. As previously mentioned herein, directional coupler 24 is connected with input test terminal 30 and directional 62 is connected with output test terminal 68. These additional directional couplers 24 and 62 provide an improved feed forward circuit by improving the accuracy of the alignment and balancing of the feed forward which, in turn, allows for an improved gain flatness and reduced signal distortion during operation of the circuit. In first circuit loop 12, additional directional coupler 24 is desirably connected with the input of amplifier 40 and in the second loop 14 the additional directional coupler 62 is desirably connected with the output of error amplifier 60. Main amplifier 40 and error amplifier 60 are examples of suitable amplification means which function to increase the gain of the signal passing therethrough. Delay lines 32 and 50 are examples of suitable delay means which serve to delay the signals the appropriate time to allow for cancellation to occur in the circuit to provide an output signal at signal output terminal 58 which signal is amplified but is substantially free of noise and distortion. Balance circuits 48, shown in functional block diagram form, can be any of a suitable number of conventionally known balance circuits or circuitry which allow for the balancing of the first circuit loop and the second circuit loop to allow for the appropriate cancellations to achieve a signal at the output signal terminal with significantly reduced noise and distortion. Directional couplers 18, 24, 34, 42, 52 and 62 are examples of suitable directional coupling means for use in feed forward circuit 10. Any of a suitable number of amplification means, directional coupler means, delay means or balance circuitry can be used in circuit 10 depending upon the particular use and application of circuit 10.

As previously mentioned, the primary purpose of a feed forward circuit is to provide distortion reduction. If the feed forward circuit operated ideally, the output signal at signal output terminal 58 would be an amplified replica of the input signal having passed through amplifier 40 of circuit 10. Assuming ideal operation of circuit 10, a signal S is applied to signal input terminal 16 and is sent in two directions by directional coupler 18 through down leg 22 and through leg 20 respectively. The signal through through leg 20 proceeds through delay line 32 and through through leg 36 of directional coupler 34. The signal S in the second direction through down leg 22 proceeds through directional coupler 24 through through leg 26 to the input of main amplifier 40. In amplifier 40, signal S is amplified and at the output of amplifier 40 signal S plus noise N and distortion D are also present. The signal S, noise N and distortion D are sent in two directions through directional coupler 42. In one direction, the output of amplifier 40, including the signal, noise and distortion, is sent through the down leg 46 of directional coupler 42 through balance circuits 48 and through the down leg 38 of directional coupler 34. At directional coupler 34 the output of main amplifier 40, including the amplified signal S, noise N and distortion D is combined out of phase with the original input signal S from delay line 32. In ideal operation, at directional coupler 34, the input signal S from delay line 32 and the signal S output from the main amplifier 40 through directional coupler 42 and through balance circuits 48 would cancel with each other at directional coupler 34, thereby isolating the signal noise N and distortion D at this point.

In circuit 10, the output of main amplifier 40, including the amplified signal S, noise N and distortion D, also proceeds through through leg 44 of directional coupler 42 through delay line 50 to directional coupler 52, where it enters directional coupler 52 through through leg 54. The signal noise N and distortion D which have been isolated in first circuit loop 12 at directional coupler 34 then proceeds through error amplifier 60 and proceeds through directional coupler 62 entering and exiting directional coupler 62 by through leg 64; and from directional coupler 62 the output of error amplifier 60 proceeds through down leg 56 of directional coupler 52. At directional coupler 52, the noise N and distortion D isolated by first loop 12 and amplified by error amplifier 60 is reinjected out of phase with the amplified signal S including noise N and distortion D from delay line 50, thereby cancelling the noise N and distortion D and leaving the amplified signal S at signal output terminal 58, if the operation of circuit 10 were ideal. In actual operation of circuit 10, input test terminal 30 and output test terminal 68 are not used and additional directional couplers 24 and 62 function to only pass therethrough the respective signals as described above.

To provide an amplified output signal S at output terminal 58 with the signal noise and distortion greatly reduced, it is necessary that the feed forward circuit, such as circuit 10 be aligned and balanced as accurately as possible. Proper alignment and balancing also allows for improved broadband gain versus frequency error, or gain flatness, in the feed forward circuit. As mentioned previously herein, various alignment and balancing techniques are known for feed forward circuits. However, various problems are associated with these techniques which have already been discussed herein.

The improved feed forward circuit 10 of the present invention promotes the reduction of these problems associated with various known techniques by the introduction of a pair of additional directional couplers into circuit 10, such as additional directional couplers 24 and 62, with one additional directional coupler connected in circuit relationship in first circuit loop 12 and the other additional directional coupler connected in circuit relationship in second circuit loop 14. Providing the additional directional couplers 24 and 62 promotes an improved and accurate alignment and balancing of the feed forward circuit in that all circuit components remain in place during the alignment so that no changes in circuit balance would occur resulting from impedance mismatching problems and the magnitude of any undesirable signal generated during alignment and balancing is significantly reduced. The additional directional couplers 24 and 62 provide an additional significant loss in signal strength of any undesirable signal through the output-to-output isolation of the additional directional coupler through which the undesired signal would pass during alignment and balancing of feed forward circuit 10.

Figure 2:
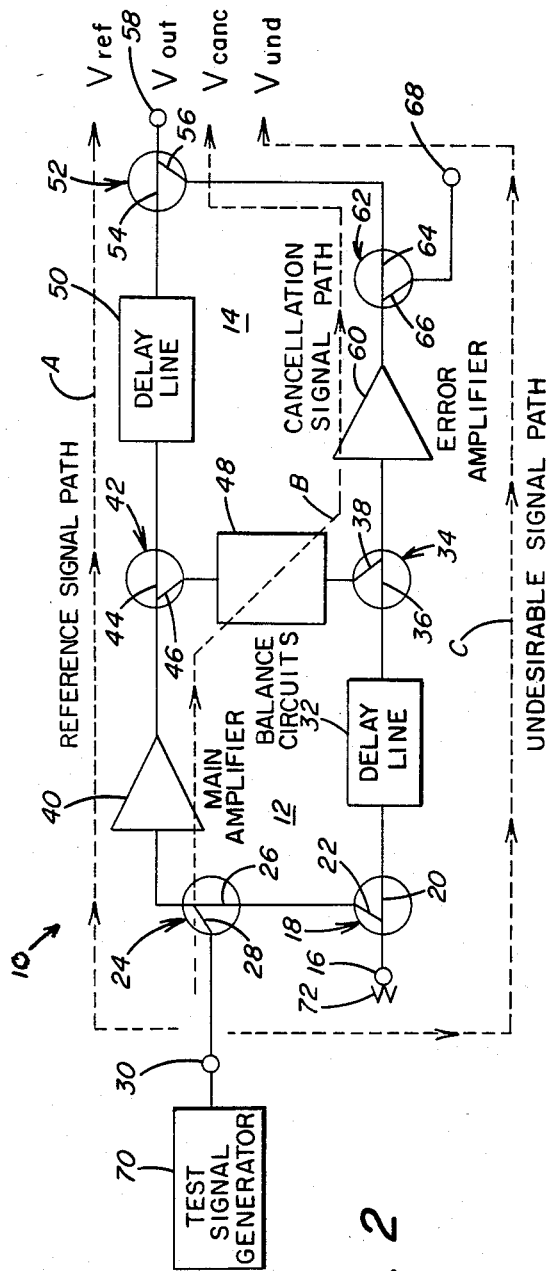
FIG. 2 shows the circuit of FIG. 1 to illustrate the method of aligning and balancing the second circuit loop, or error loop.
Figure 3:
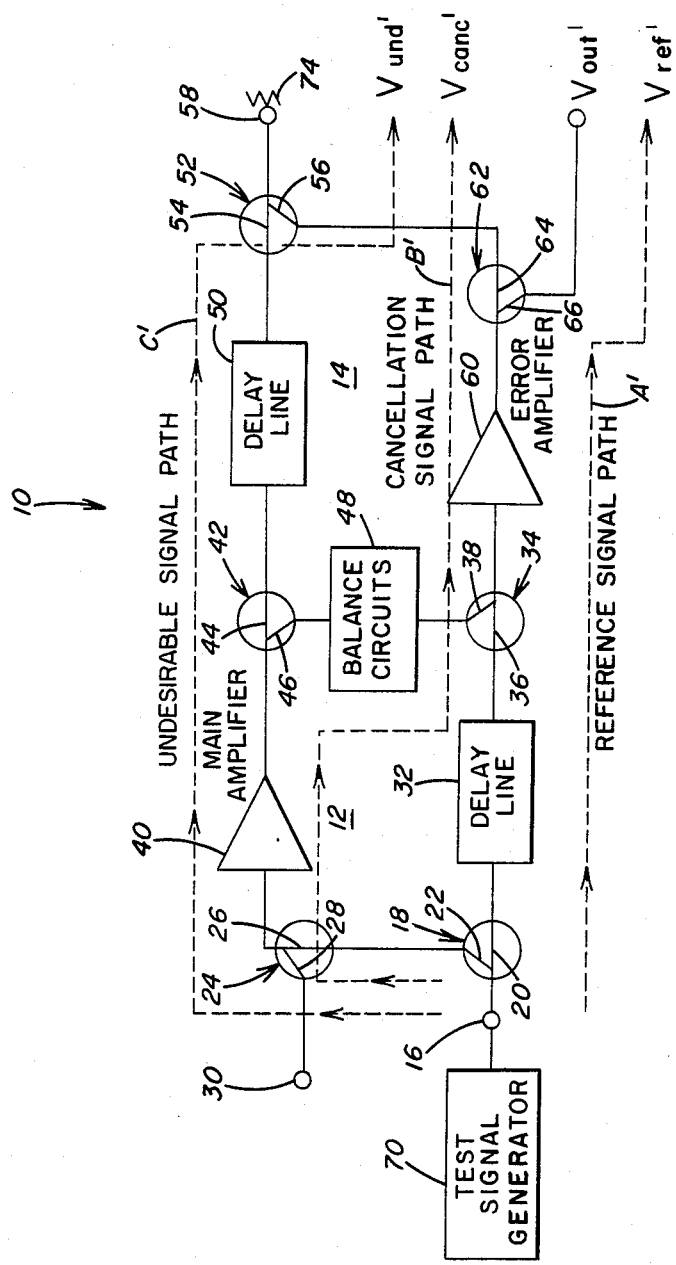
FIG. 3 shows the circuit of FIG. 1 to illustrate the method of balancing and aligning of the first circuit loop, or main loop.

Referring to FIGS. 2 and 3, a method of balancing feed forward circuit 10 utilizing additional directional couplers 24 and 62 is illustrated therein. FIG. 2, illustrates the alignment and balancing of the error loop, or second circuit loop 14; and FIG. 3 illustrates the alignment and balancing of the main loop, or first circuit loop 12. Both the first circuit loop and the second circuit loop desirably should be balanced to achieve a high degree of accuracy and reliability in the alignment and balancing process of feed forward circuit 10.

FIG. 2 illustrates a method of aligning and balancing the error loop, or second circuit loop 14, of feed forward circuit 10. A test signal generator 70 generates a test signal at input test terminal 30 having a magnitude of $V_{in}$. Error amplifier 60 is turned off, but left in circuit 10, and a test signal from test signal generator 70 is input into circuit 10 through input test terminal 30 and proceeds through directional coupler 24, main amplifier 40, directional coupler 42, delay line 50, and directional coupler 52 producing a reference signal having a magnitude of $V_{ref}$ which measured at signal output terminal 58. The reference signal path is indicated by the letter A in FIG. 2. The magnitude of $V_{ref}$ is the magnitude of $V_{in}$ plus the gain of the main amplifier 40 minus the losses in signal strength produced by directional couplers 24, 42, and 52, and the loss produced by delay line 50.

After the reference signal has been determined, the magnitude of the cancellation signal $V_{canc}$ is adjusted by adjusting the loss of the balance circuits 48 to attempt to match as closely as possible the magnitude characteristics of the reference signal. While combining the cancellation signal with the reference signal out of phase. To do this, amplifier 60 is turned on and a test signal is input through input test terminal 30. The reference signal then passes along reference signal path A to signal output terminal 58 and a cancellation signal following cancellation signal path B proceeds through directional coupler 24, main amplifier 40, directional coupler 42, balance circuits 48, directional coupler 34, error amplifier 60, directional coupler 62, and directional coupler 52 having a magnitude of $V_{canc}$ at signal output terminal 58. In addition to adjusting the loss of the balancing circuits, directional coupler 56 is also desirably adjusted to obtain approximately a 180 degree phase shift. Ideally, the magnitude of the output voltage $V_{out}$ measured would ideally be a combination of the magnitude of the two signals $V_{ref}$ and $V_{canc}$. The degree of precision in balancing of the circuit is to reduce the magnitude of the combination of $V_{ref} - V_{canc}$.

Additionally, however, at the signal output terminal is an undesirable signal having a magnitude $V_{und}$. Therefore, what is measured at the signal output terminal is $V_{ref} - V_{canc}$ plus or minus $V_{und}$. The undesirable signal output path C is shown in FIG. 2. The undesired signal path proceeds through directional coupler 24, directional coupler 18, delay line 32, directional coupler 34, error amplifier 60, directional coupler 62, and directional coupler 52 having an output magnitude of $V_{und}$ at signal output terminal 58. However, unlike prior art feed forward circuits and methods of alignment and balancing of such circuits, feed forward circuit 10 and the method of aligning and balancing feed forward circuit 10 by use of the additional directional coupler 24 connected to input test terminal 30 provides a significant amount of additional loss in strength to the undesirable signal through the output-to-output isolation provided by directional coupler 24, since the undesirable signal path C through both the down leg 28 and the through leg 26 of directional coupler 24. The magnitude of the undesired signal is substantially reduced due to the output-to-output isolation of the directional coupler. With the magnitude of $V_{und}$ significantly reduced, it is possible to accurately measure the magnitude of the difference between $V_{ref}$ and $V_{canc}$ to adjust the circuit and provide for an accurate alignment and balance of the second circuit loop, or error loop; and achieve accuracy and reliability of high value cancellation, typically greater than 30 dB, over that possible in the alignment and balancing of known feed forward circuits. Additionally, a terminating resistor 72 is desirably connected at signal input terminal 16 to prevent any flow of signal therethrough during the aligning and balancing of the error loop, or the second circuit loop 14.

Referring to FIG. 3, the method of the invention for testing the main loop, or first circuit loop 12, is illustrated therein. In FIG. 3, a reference signal is first obtained by turning off main amplifier 40 and injecting a test signal at signal input terminal 16 to obtain a reference signal having a magnitude of $V_{ref}'$ which is measured at output test terminal 68. In determing the reference signal magnitude, the test signal, with main amplifier 40 off, would proceed through directional coupler 18, delay line 32, directional coupler 34, error amplifier 60, and directional coupler 62 with the magnitude $V_{ref}'$ being measured at output test terminal 68. Reference signal path A' is shown in FIG. 3. The magnitude of the cancellation signal $V_{canc}'$ is adjusted by adjusting the loss of the balance circuits 48 to attempt to match as closely as possible the magnitude characteristics of the reference signal. This is accomplished by combining the cancellation signal with the reference signal out of phase. To accomplish this, the main amplifier 40 is turned on and a test signal S from test signal generator 70 is injected at signal input terminal 16. The cancellation signal path B° for the cancellation signal proceeds from signal input terminal 16 through directional coupler 18, through directional coupler 24, main amplifier 40, directional coupler 42, balance circuits 48, directional coupler 34, error amplifier 60, and through directional coupler 62 to have a magnitude of $V_{canc}$ at output test terminal 68. Desirably, similar to FIG. 2, directional coupler 36 is also adjusted to obtain an approximate 180° phase shift. Ideally, the magnitude of the output voltage $V_{out}'$ measured is a combination of the magnitude of $V_{ref}'$ and $V_{canc}'$. The degree of precision in balancing the circuit is to reduce the combination of the magnitude of $V_{ref}'$ - $V_{canc}'$.

However, in addition to the reference signal and the cancellation signal, an undesirable signal having a magnitude $V_{und}'$ is also present at output test terminal 68. The undesirable signal path C' is shown in FIG. 3. When test signal generator 70 sends a test signal through signal input terminal 16, the path of the undesirable signal proceeds through directional coupler 18, directional coupler 24, main amplifier 40, directional coupler 42, delay line 50, directional coupler 52, and through directional coupler 62 to produce an undesirable signal having a magnitude $V_{und}'$ at output test terminal 68. The presence of an undesirable signal when balancing the main loop in prior feed forward circuits and methods of alignment has caused concern with regard to the accuracy of the cancellation measurements made when attempting to measure $V_{ref}'$ - $V_{canc}'$. However, in the improved feed forward circuit 10 and the method of the present invention for balancing the main loop, or first circuit loop 12, the undesirable signal must past through both the through leg and down leg of additional directional coupler 62 in second circuit loop 14. In passing through additional directional coupler 62, the magnitude of the undesirable signal is significantly reduced resulting from the output-to-output isolation of additional directional coupler 62. This reduction in the magnitude of the undesirable signal by having the undesirable signal pass through additional directional coupler 62 achieves accuracy and reliability of high value cancellation, typically greater than 30 dB, over that achievable by known feed forward circuit and methods of alignment and balancing. The reduction in magnitude of $V_{und}'$ permits a reliable measurement of the difference in magnitude between $V_{ref}'$ and $V_{canc}'$ to provide for an accurate alignment and balance of the main loop, or first circuit loop 12, of feed forward circuit 10. Additionally, a terminating resistor 74 is desirably connected at signal output terminal 58 to prevent any signal flow there through during the aligning and balancing of the main loop, or first circuit loop 12.

In summary, the present invention provides an improved feed forward circuit and a method for balancing an aligning a feed forward circuit which utilizes two additional directional couplers to improve the accuracy of the alignment and balancing process. By improving the alignment and balancing process, improved gain flatness and improved distortion reduction characteristics are provided in the feed forward circuit of the invention.

According to the provisions of the patent statutes, we have explained the principal, preferred construction and mode of operation of our invention and have illustrated and described what we now consider to represent its best embodiments. However, it should be understood that, within the scope of the appended claims, the invention may be practiced otherwise than as specifically illustrated and described.

We claim:

1. An improved feed forward circuit, said feed forward circuit including a first circuit loop to isolate signal noise and distortion and a second circuit loop to reduce signal noise and distortion, said first circuit loop and said second circuit loop having directional coupler means, amplification means, and delay means, and said first circuit loop and said second circuit loop being interconnected through a pair of common directional coupler means having common balance circuitry connected therebetween, and said first circuit loop having a signal input terminal and an input test terminal and said second circuit loop having a signal output terminal and an output test terminal, wherein the improvement comprises,
   a pair of additional directional coupler means, one of said additional directional coupler means being connected in circuit relationship with said first circuit loop and said input test terminal and the other of said additional directional coupler means being connected in circuit relationship with said second circuit loop and said output test terminal, said additional directional coupler means being operable to promote accurate alignment and balance of said feed forward circuit and improve gain flatness and reduce signal distortion during operation thereof.

2. The improved feed forward circuit as set forth in claim 1 wherein,
   said additional directional coupler means in said first circuit loop is connected in circuit relationship with the input of said amplification means in said first circuit loop.

3. The improved feed forward circuit as set forth in claim 1 wherein,
   said additional directional coupler means in said second circuit loop is connected in circuit relationship with the output of said amplification means in said second circuit loop.

4. The improved feed forward circuit as set forth in claim 1 wherein,
   said additional directional coupler means in said first circuit loop is connected in circuit relationship with the input with said amplification means in said first circuit loop, and
   said additional directional coupler means in said second circuit loop is connected in circuit relationship with the output of said amplification means in said second circuit loop.

5. The improved feed forward circuit as set forth in claim 4 wherein,
   said additional directional coupler means are directional couplers.

6. A method for aligning and balancing a feed forward circuit, said feed forward circuit including a first circuit loop to isolate signal noise and distortion and a second circuit loop to reduce signal noise and distortion, said first circuit loop and said second circuit loop having directional coupler means, amplification means, and delay means, and said first circuit loop and said second circuit loop being interconnected through a pair of common directional coupler means having common balance circuitry connected therebetween, and said first circuit loop having a signal input terminal, an input test terminal, and an additional directional coupler means, said additional directional coupler means being connected with said input test terminal, and said second circuit loop having a signal output terminal, and output test terminal, and an additional directional coupler means, said additional directional coupler means being connected with said output test terminal, comprising the steps of, providing a test signal at said input test terminal of said first circuit loop, passing said test signal from said input test terminal through said additional directional coupler means and said amplification means of said first circuit loop, one of said common directional coupler means, said delay means and said directional coupler means of said second circuit loop to provide a reference signal having a magnitude of $V_{ref}$ at said signal output terminal of said second circuit loop, passing said test signal from said input test terminal through said additional directional coupler means and said amplification means of said first circuit loop, one of said common directional coupler means, said balance circuitry, the other of said common directional coupler means, said amplification means and said additional directional coupler means and said directional coupler means of said second circuit loop to provide a cancellation signal having a magnitude of $V_{canc}$ at said signal output terminal of said second circuit loop, and measuring the difference between the magnitude of $V_{ref}$ and $V_{canc}$ at said signal output terminal to provide for an accurate alignment and balance of said second circuit loop in said feed forward circuit, said additonal directional coupler means of said first circuit loop substantially reducing the magnitude of any undesirable signal at said signal output terminal of said second circuit loop allowing an accurate measurement of the difference between $V_{ref}$ and $V_{canc}$.

7. A method for aligning and balancing a feed forward circuit, said feed forward circuit including a first circuit loop to isolate signal noise and distortion and a second circuit loop to reduce signal noise and distortion, said first circuit loop and said second circuit loop having directional coupler means, amplification means, and delay means, and said first circuit loop and said second circuit loop being interconnected through a pair of common directional coupler means having common balance circuitry connected therebetween, and said first circuit loop having a signal input terminal, and input test terminal, and an additional directional coupler means, said additional directional coupler means being connected with said input test terminal, and said second circuit loop having a signal output terminal, an output test terminal, and an additional directional coupler means, said additional directional coupler means being connected with said output test terminal, comprising the steps of, providing a test signal at said signal input terminal of said first circuit loop, passing said test signal from said signal input terminal through said directional coupler means and said delay means of said first circuit loop, one of said common directional coupler means, said amplification means and said additional directional coupler means of said second circuit loop, to provide a reference signal having a magnitude of $V_{ref}'$ at said output test terminal of said second circuit loop, passing said test signal from said signal input terminal through said directional coupler means and said additional directional coupler means and said amplification means of said first circuit loop, one of said common directional coupler means, said common balance circuitry, the other of said common directional coupler means, said amplification means and said additional directional coupler means of said second circuit loop to provide a cancellation signal having a magnitude of $V_{canc}'$ at said output test terminal of said second circuit loop, and measuring the difference between $V_{ref}'$ and $V_{canc}'$ at said output test terminal to provide for an accurate alignment and balance of said first circuit loop, said additional directional coupler means of second circuit loop substantially reducing the magnitude of any undesirable signal at said output test terminal of said second circuit loop allowing accurate measurement of the difference between $V_{ref}'$ and $V_{canc}'$.

8. The method as set forth in claim 7 further comprising the steps of, providing a test signal at said input test terminal of said first circuit loop, passing said test signal from said input test terminal through said additional directional coupler means and said amplification means of said first circuit loop, one of said common directional coupler means, said delay means and said directional coupler means of said second circuit loop to provide a reference signal having a magnitude of $V_{ref}$ at said signal output terminal of said second circuit loop, passing said test signal from said input test terminal through said additional directional coupler means and said amplification means of said first circuit loop, one of said common directional coupler means, said common balance circuitry, the other of said common directional coupler means, said amplification means and said additional directional coupler means and said directional coupler means of said second circuit loop to provide a cancellation signal having a magnitude of $V_{canc}$ at said signal output terminal of said second circuit loop, and measuring the difference between the magnitude of $V_{ref}$ and $V_{canc}$ at said signal output terminal to provide for an accurate alignment and balance of said second circuit loop in said feed forward circuit, said additional directional coupler means of said first circuit loop substantially reducing the magnitude of any undesirable signal at said signal output terminal of said second circuit loop allowing an accurate measurement of the difference between $V_{ref}$ and $V_{canc}$.

\* \* \* \* \*